(12) United States Patent
Kim et al.

(10) Patent No.: US 6,956,433 B2
(45) Date of Patent: Oct. 18, 2005

(54) POLYNOMIAL PREDISTORTER USING COMPLEX VECTOR MULTIPLICATION

(75) Inventors: Dong-Hyun Kim, Suwon-si (KR); Dong-Won Shin, Seoul (KR)

(73) Assignee: Samsung Electronics Co. Ltd., Suwon-si (KR)

(*) Notice: Subject to any disclaimer, the term of this patent is extended or adjusted under 35 U.S.C. 154(b) by 61 days.

(21) Appl. No.: 10/772,348

(22) Filed: Feb. 6, 2004

(65) Prior Publication Data

US 2004/0155707 A1 Aug. 12, 2004

(30) Foreign Application Priority Data

Feb. 6, 2003 (KR) .............................. 10-2003-0007603

(51) Int. Cl.[7] .............................. H03F 1/26; H03F 1/30
(52) U.S. Cl. ...................... 330/149; 375/296; 375/297
(58) Field of Search .............................. 330/136, 149; 375/296–297

(56) References Cited

U.S. PATENT DOCUMENTS

| | | | | | |
|---|---|---|---|---|---|
| 5,886,584 | A | * | 3/1999 | Tanai et al. ................ | 332/103 |
| 6,075,411 | A | * | 6/2000 | Briffa et al. ................ | 330/149 |
| 6,141,390 | A | * | 10/2000 | Cova .......................... | 375/297 |
| 6,252,914 | B1 | * | 6/2001 | Yamamoto ................... | 375/296 |
| 6,587,513 | B1 | * | 7/2003 | Ichihara ...................... | 375/296 |

* cited by examiner

Primary Examiner—Peguy Jeanpierre
Assistant Examiner—Khai Nguyen
(74) Attorney, Agent, or Firm—Roylance, Abrams, Berdo & Goodman, LLP

(57) ABSTRACT

A polynomial predistorter and predistorting method for predistorting a complex modulated baseband signal are provided. In the polynomial predistorter, a first complex multiplier generates first complex predistortion gains, using a current input signal and complex polynomial coefficients modeled on the inverse non-linear distortion characteristic of the power amplifier, and multiplies them by I and Q signal components of the current input signal, respectively. At least one second complex multiplier generates second complex predistortion gains using the complex polynomial coefficients and previous predistorted signals and multiplies them by I and Q signal components of the previous predistorted signals, respectively. A summer sums the outputs of the first and second complex multipliers and outputs the sum as a predistorted signal to the power amplifier.

12 Claims, 4 Drawing Sheets

POLYNOMIAL PREDISTORTER USING COMPLEX VECTOR MULTIPLICATION

PRIORITY

This application claims priority under 35 U.S.C. §119 to an application entitled "Polynomial Predistorter Using Complex Vector Multiplication" filed in the Korean Intellectual Property Office on Feb. 6, 2003 and assigned Serial No. 2003-7603, the contents of which are incorporated herein by reference.

BACKGROUND OF THE INVENTION

1. Field of the Invention

The present invention relates generally to wideband power amplification, and in particular, to a predistorter and predistorting method for linearizing the non-linear distortion characteristic of a complex modulated baseband signal, caused by a power amplifier.

2. Description of the Related Art

In a typical mobile communication system that communicates via radio frequency (RF) signals, RF amplifiers are categorized as being low-power, low-noise receive amplifiers or high-power transmit amplifiers (HPA). The efficiency of the high-power transmit amplifier is a greater consideration than noise. The high-power amplifier is widely used in mobile communication applications and operates near a non-linear operation point to achieve high efficiency.

Intermodulation distortion (IMD) from the amplifier output adversely affects out of band frequencies as well as in band frequencies with spurious signals. A feed forward method is usually adopted to eliminate the spurious component. Despite the advantage of perfect elimination of the spurious component, however, the feed forward method has low amplification efficiency and requires control at an RF stage. Therefore, the HPA becomes bulky and increases system cost.

Digital predistortion (DPD) is being studied as a means of providing high efficiency and low cost in the mobile communication industry. The DPD precompensates an input signal with an inverse of the non-linearity of a power amplifier at a digital stage and renders the amplifier output linear. The non-linearity of the power amplifier shows up as Amplitude Modulation to Amplitude Modulation (AM to AM) conversion distortion and Amplitude Modulation to Phase Modulation (AM to PM) conversion distortion. The AM to AM conversion distortion is defined as a change in the amplitude of an output signal compared to the amplitude of an input signal, while the AM to PM conversion distortion is defined as a change in the phase of the output signal compared to the amplitude of the input signal.

Most predistorters apply to single tone frequency signals or narrow band frequency signals. Therefore, they generally compensate for the memoryless non-linearity of a power amplifier. The memoryless non-linearity refers to the present output being influenced by the present input only. However, the memoryless non-linearity of the non-linear amplifier at a wideband frequency causes previous input signals as well as the present input signal to affect the present amplifier output, thereby substantially changing the AM to AM and AM to PM characteristics. This phenomenon is called memory effects. The non-linearity of a power amplifier varies with the frequency bandwidth of an input signal.

The increasing use of wideband frequencies in mobile communication systems has motivated research and development on the memoryless effects of non-linear amplifiers. A main technique of compensating for both the memoryless non-linearity and memory effects of a non-linear amplifier applies a simplified Volterra model. A Volterra series can be seen as a Taylor series with a memory. The Volterra series is used to accurately model a non-linear system. A Volterra model predistorter eliminates the non-linearity of a non-linear amplifier using an inverse of a Volterra series model that accurately simulates the non-linearity.

For the Volterra model, the predistortion characteristic to linearize a power amplifier with a memory is expressed as a discrete Volterra series with a finite memory. A signal d(n) predistorted by modifying the discrete Volterra series to a finite discrete Volterra series is represented by $$d(n) = h_{volterra}(n) E X_{volterra}(n) \tag{1}$$

And a Volterra kernel vector $h_{volterra}$ and an input signal vector $x_{volterra}$ are given as $$h_{volterra}(n) = [h_1(0), h_1(1), h_1(2), \ldots, h_1(m-1), h_3(0,0), h_3(0,1), h_3(0,2), \ldots, h_3(0,m-1), \ldots,$$

$$h_3(1,0), h_3(1,1), h_3(1,2), \ldots, h_3(1,m-1), \ldots h_3(m-1,m-1)]$$

$$x_{volterra}(n) = [x(n), x(n-1), x(n-2), \ldots, x(n-m-1), x(n)|x(n)|^2, x(n-1)|x(n)|^2, x(n-2)|x(n)|^2, \ldots, x(n-m-1)|x(n)|^2,$$

$$x(n)|x(n-1)|^2, x(n-1)|x(n-1)|^2, \ldots, x(n-m-1)|x(n-1)|^2, \ldots, x(n-m-1)|x(n-m-1)|^2]^T \tag{2}$$

where $h_i(m,n)$ is the complex predistortion gain for an ith-order signal, that is, the gain of mth and nth previous input signal samples in combination. As noted, this predistorter is configured in an Finite Impulse Response (FIR) structure and considers previous input signal samples up to an mth one.

The predistorter generates the predistorted signal d(n) by multiplying a complex input signal by the complex gain. After the signal is amplified in an HPA, the signal d(n) is linearized. By separating the Volterra kernel vector $h_{volterra}$ and the input signal vector $x_{volterra}$ into in-phase (I) signal components and quadrature-phase (Q) signal components, multiplication in the predistorter is expressed as $$(A+jB)(p+jq) = Ap - Bq + j(Aq + Bp) \tag{3}$$

where A and B denote the I and Q signal components of an input signal, respectively, and p and q denote I and Q predistortion gains extracted by an adaptation algorithm, respectively.

As noted from Eq. (3), the predistorter using the discrete Volterra series experiences a rapid increase in computation volume with a modulation order. Moreover, if an input signal vector is formed from previous (m31 1) values and applied to the input of a power amplifier influenced by $m_{PA}$ finite memory samples, the number of previous input signal samples that affect the power amplifier is $m_{PA}+m-1$. Thus, the power amplifier is affected by more memory samples than the predistorter and the predistorter fails to appropriately linearize the non-linearity of the power amplifier. This is attributed to lack of sufficient information required to generate a predistorted signal in the predistorter.

Despite different distortions in the I and Q signals of the amplifier output, the same predistortion gain is multiplied by the I and Q signals, thereby limiting predistortion gains. Therefore, errors may occur in the predistortion signal for linearizing the power amplifier and full linearization cannot be achieved.

SUMMARY OF THE INVENTION

An object of the present invention is to substantially solve at least the above problems and/or disadvantages and to provide at least the advantages below. Accordingly, an object of the present invention is to provide a predistorter using a more simplified complex polynomial.

Another object of the present invention is to provide a polynomial predistorter using an indirect training architecture.

A further object of the present invention is to provide a predistorter of an Infinite Impulse Response (IIR) structure, for generating a predistortion signal using a previous output signal instead of a previous input signal.

Still another object of the present invention is to provide a predistorter for compensating for the non-linearity of a power amplifier by multiplying the I and Q signal components of an input signal by correspondingly different predistortion gains.

The above objects are achieved by a polynomial predistorter and predistorting method for predistorting a complex modulated baseband signal, providing the predistorted signal to a power amplifier, and compensating for the non-linear distortion characteristic of the power amplifier using complex vector multiplication. In the polynomial predistorter, a first complex multiplier generates first complex predistortion gains using a current input signal and complex polynomial coefficients, for I and Q signal predistortion, and multiplies the first complex predistortion gains by I and Q signal components of the current input signal, respectively. Here, the complex polynomial coefficients are modeled on the inverse non-linear distortion characteristic of the power amplifier. At least one second complex multiplier generates second complex predistortion gains using the complex polynomial coefficients and previous predistorted signals corresponding to the complex polynomial coefficients, for I and Q signal predistortion, and multiplies the second complex predistortion gains by I and Q signal components of the previous predistorted signals, respectively. A summer generates a predistorted signal by summing the outputs of the first and second complex multipliers and outputs the predistorted signal to the power amplifier.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

An embodiment of the present invention will be described herein below with reference to the accompanying drawings. In the following description, well-known functions or constructions are omitted for conciseness.

In accordance with an embodiment of the present invention, a predistorted signal is generated using a current input signal and previous predistorted signals. Predistortion gains, which are multiplied by the current input signal and the previous predistorted signals for generation of the predistorted signal, are achieved through indirect training.

Figure 1:
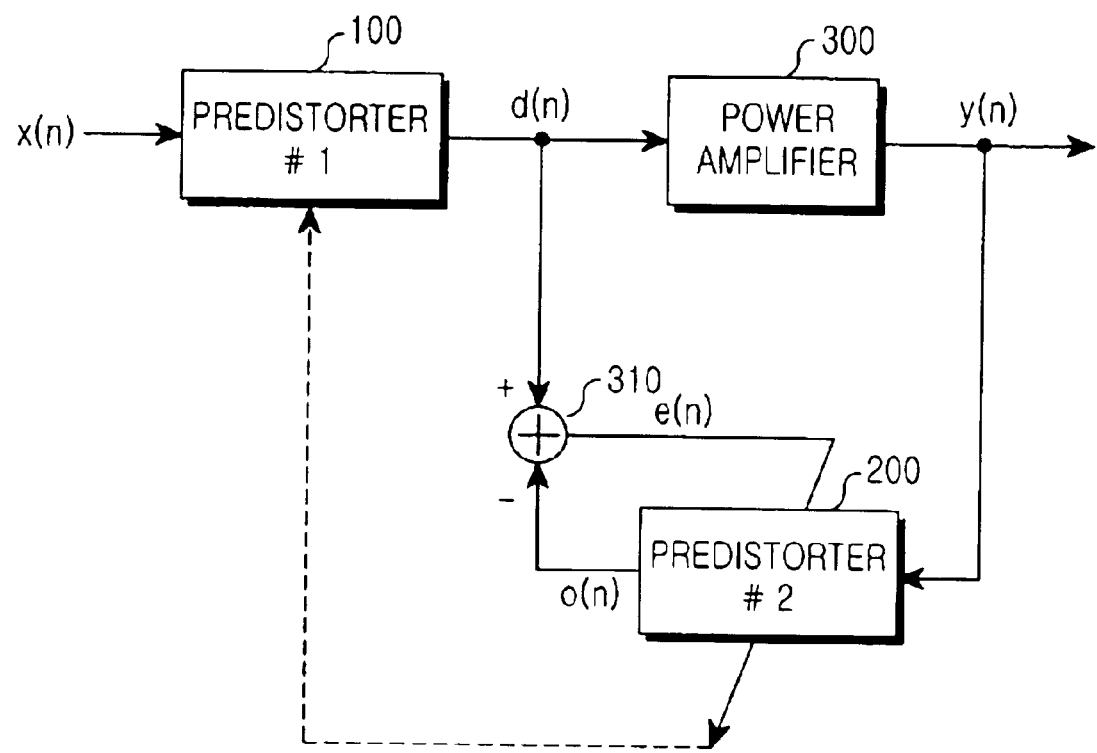
FIG. 1 is a block diagram illustrating a transmitter for outputting a linearized amplified signal by use of polynomial predistorters according to an embodiment of the present invention.

FIG. 1 illustrates a transmitter that outputs a linearized amplified signal by use of polynomial predistorters based on an indirect training architecture according to an embodiment of the present invention.

Referring to FIG. 1, the transmitter includes two predistorters 100 and 200 which use the same predistortion polynomial coefficients to estimate the non-linear distortion characteristic of a power amplifier 300.

When necessary, an error correction circuit for correcting gain and phase errors possibly generated from an analog quadrature modulator, a Direct Current (DC) offset cancellation circuit for eliminating leakage power, a digital quadrature modulator, a digital to analog converter, a band pass filter, and a frequency upconverter can be inserted between the first predistorter 100 and the power amplifier 300. Also, a frequency downconverter, a band pass filter, an analog to digital converter, and a digital quadrature demodulator can be inserted between the power amplifier 300 and the second predistorter 200. Since the above components are not characteristic of the embodiment of the present invention, they are not shown here.

The first predistorter 100 provides an input complex modulated baseband signal x(n) and a first predistorted signal d(n) to the power amplifier 300. d(n) is a signal predistorted by means of polynomial coefficients modeled on the inverse non-linear distortion characteristic of the power amplifier 300. An amplified signal y(n) output from the power amplifier 300 is provided to the second predistorter 200.

The second predistorter 200 outputs a second predistorted signal o(n) resulting from predistorting y(n) by means of the same polynomial coefficients as those for the first predistorter 100. It is ideal that the second predistorter 200 outputs the same signal as the first predistorted signal for the input of y(n). For this purpose, an error calculator 310 generates an error signal e(n) by subtracting o(n) from d(n) and the second predistorter 200 updates the polynomial coefficients by a known adaptation algorithm such that the power or magnitude of e(n) is minimized. The updated polynomial coefficients are applied to the first predistorter 100.

Thus, the first and second predistorters 100 and 200 operate based on the updated polynomial coefficients, and as the updating is repeated, the output of the power amplifier 300 is gradually linearized.

The first and second predistorters 100 and 200 output predistorted signals using a current input signal and previous predistorted signals.

Figure 2:
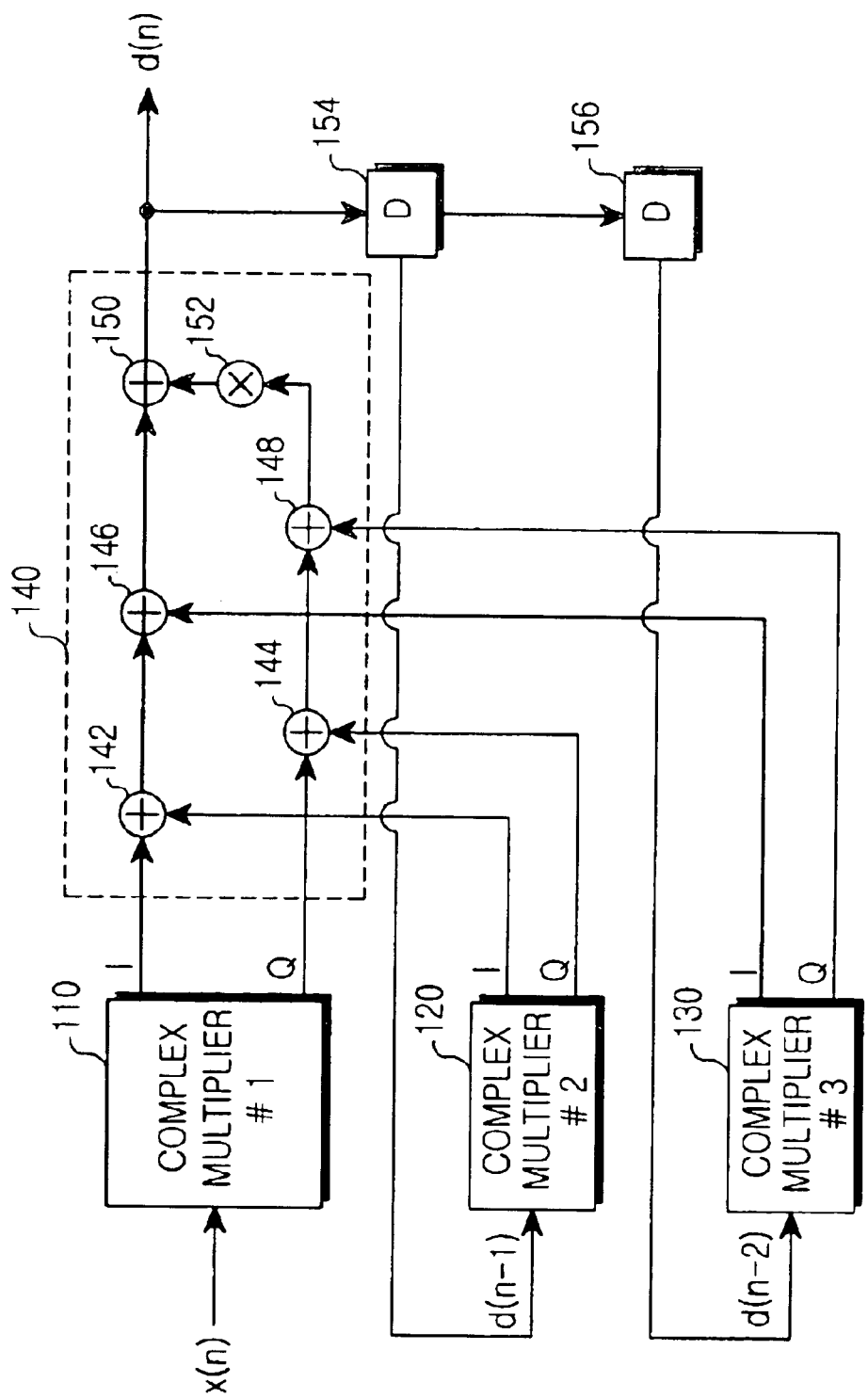
FIG. 2 is a block diagram illustrating a first predistorter illustrated in FIG. 1, for outputting a first predistortion signal d(n) for the input of a signal x(n) according to an embodiment of the present invention.

FIG. 2 illustrates the first predistorter 100 that outputs the first predistorted signal d(n) for the input of the signal x(n) according to an embodiment of the present invention. The first predistorter 100 is assumed to use two previous predistorted signal samples. The structure and operation of the first predistorter 100 as described below are also applied to the second predistorter 200.

Referring to FIG. 2, a first complex multiplier 110 multiplies the I and Q signal components of x(n) by corresponding predistortion gains. The outputs of the first complex multiplier 110 are combined with the outputs of second and third complex multipliers 120 and 130, thereby producing the first predistorted signal d(n). The second complex multiplier 120 multiplies a signal d(n−1) obtained by delaying d(n) one sample time in a delay 154 by corresponding predistortion gains. The third complex multiplier 130 multiplies a signal d(n−2) obtained by delaying d(n) two sample times in delays 154 and 156 by corresponding predistortion gains.

A summer 140 sums the I and Q outputs of the first, second and third complex multipliers 110, 120 and 130 at I component adders 142 and 146 and at Q component adders 144 and 148. A multiplier 152 shifts the Q signal component sum by 90° and an adder 150 adds the shifted Q signal component to the I signal component sum, thus outputting the first predistorted signal d(n).

Figure 3:
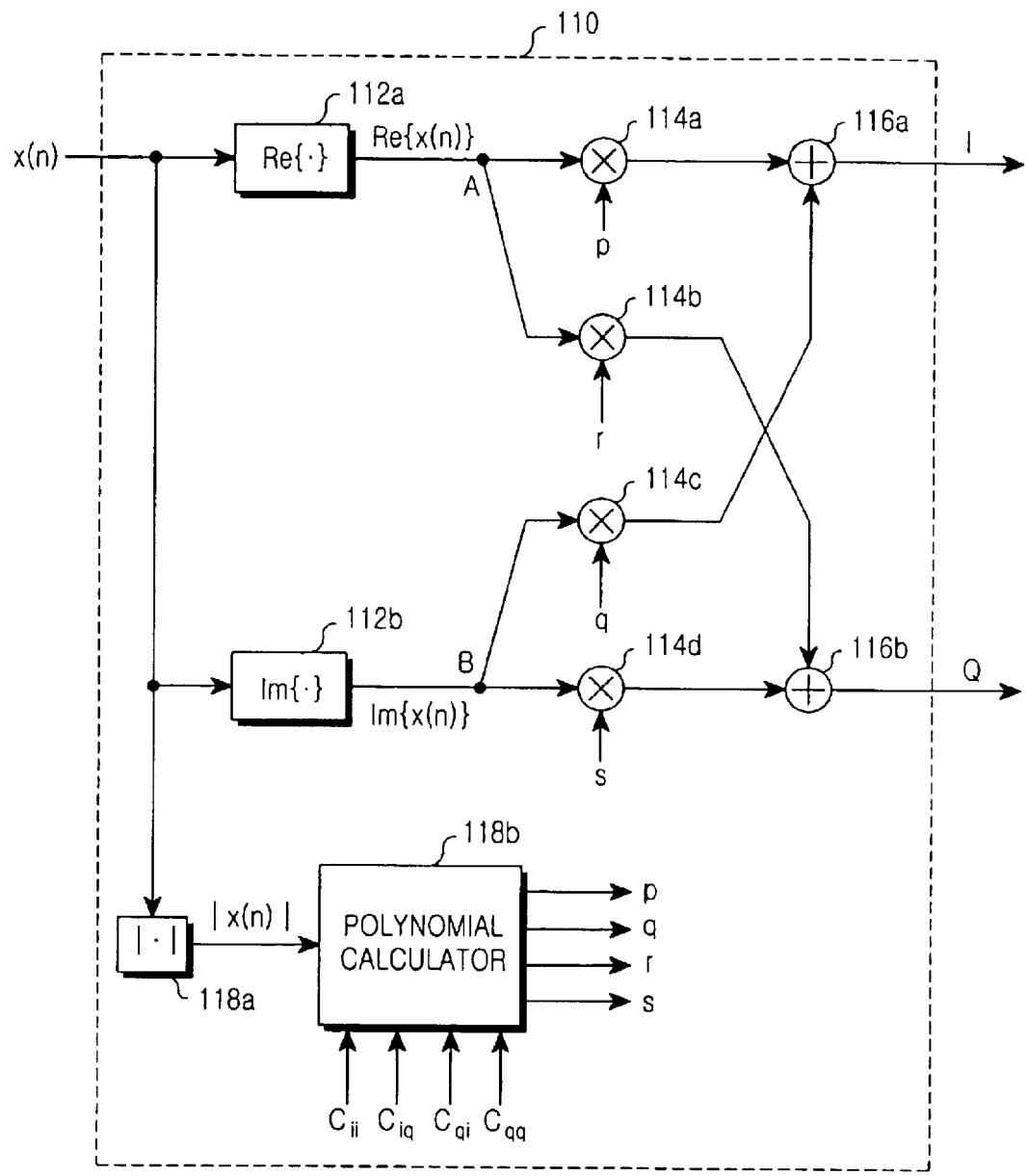
FIG. 3 is a detailed view illustrating a first complex multiplier according to an embodiment of the present invention.

FIG. 3 illustrates the first complex multiplier 110 in detail, as a representative of the complex multipliers 110, 120 and 130 according to an embodiment of the present invention. Referring to FIG. 3, the first complex multiplier 110 detects the I signal component Re{x(n)} of x(n) through a real number detector 112a and the Q signal component Im{x(n)} of x(n) through an imaginary number detector 112b. The detected signal components are fed to four multipliers 114a to 114d.

The first complex multiplier 110 detects the magnitude 1x(n)1 of x(n) through an absolute value calculator 118a. A polynomial calculator 118b generates I predistortion gains p and q and Q predistortion gains r and s by calculating a predistortion polynomial using 1x(n)1 and complex polynomial coefficients $c_i$ and $c_q$ calculated by indirect training in the second predistorter 200.

The multipliers 114a and 114b multiply Re{x(n)} by p and r and the multipliers 114c and 114d multiply Im{x(n)} by q and s. That is, p and r are predistortion gains for the I signal component of x(n), while q and s are predistortion gains for the Q signal component of x(n). An adder 116a adds the outputs of the multipliers 114a and 114c and outputs the sum as the I signal component, and an adder 116b adds the outputs of the multipliers 114b and 114d and outputs the sum as the Q signal component.

In the same manner, the second and third complex multipliers 120 and 130 generate predistortion gains by calculating a predistortion polynomial using input signal magnitudes 1d(n−1)1 and 1d(n−2)1 and the same complex polynomial coefficients and multiply the predistortion gains by the I and Q signal components of the input signals d(n−1) and d(n−2).

Compared to conventional technology, the predistortion of an input signal in the predistortion structure configured as illustrated in FIGS. 2 and 3 is expressed as $$[A\ B\ A\ B][p\ q\ jr\ js]^T = Ap + Bq + j(Ar + Bs) \quad (4)$$

where A and B denote the I and Q signal components of the input signal, respectively and p, q, r and s denote I and Q predistortion gains extracted by the adaptation algorithm. As stated before, p and r are I and Q predistortion gains by which the I signal component, A of the input signal is predistorted, while q and s are I and Q predistortion gains by which the Q signal component, B of the input signal is predistorted.

These predistortion gains are achieved by calculating the predistortion polynomial using the complex polynomial coefficients obtained by indirect training. As is known, the indirect training is a scheme of realizing linearization without knowledge of the characteristic model of a power amplifier, and polynomial coefficients for compensating for the non-linearity of the power amplifier are computed by the adaptation algorithm. Now, a description will be made of the predistortion according to the embodiment of the present invention, taking the first predistorter 100 illustrated in FIG. 1 as an example.

The predistorted signal d(n) is $$d(n) = d_i(n) + j d_q(n) = x(n) E (c_i + j c_q) \quad (5)$$

where n is the time index of a sample unit and ci and $c_q$ are the respective I and Q signal components of a complex polynomial coefficient for the input signal x(n).

Using a P-order polynomial and previous samples before up to an Mth sample time, the input signal x(n) and the complex polynomial coefficients are given in the form of matrices as follows.

$x(n) = [x_i(n), x_q(n), x_i(n)|x(n)|, x_q$ $(n)|x(n)|, \ldots, x_i(n)|x(n)|^{P-1}, x_q(n)|x$ $(n)|^{P-1}, d_i$ $(n-1), d_q(n-1), d_i(n-1)|d(n-1)|, d_q$ $(n-1)|d$ $(n-1)|, \ldots, d_i$ $(n-1)|d(n-1)|^{P-1}$ $, d_q(n-1)|d$ $(n-1)|^{P-1}, d_i(n-M),$ $d_q(n-M), d_i(n-M)|d$ $(n-M)|, d_q(n-M)|d$ $(n-M)|, \ldots, d_i(n-M)|d$ $(n-M)|^{P-1}, d_q(n-M)|d$ $(n-M)|^{P-1}]$ $c_i = [c_{ii,0,0}, c_{iq,0,0}, \ldots, c_{ii,0,(P-1)}, c_{iq,0,(P-1)}, c_{ii,1,0}, c_{iq,1,0}, \ldots, c_{ii,1,(P-1)}, c_{iq,1,(P-1)}, \ldots, c_{ii,M,0}, c_{iq,M,0}, \ldots, c_{ii,M,(P-1)}, c_{iq,M,(P-1)}]^T$ $c_q = [c_{qi,0,0}, c_{qq,0,0}, \ldots, c_{qi,0,(P-1)}, c_{qq,0,(P-1)}, c_{qi,1,0}, c_{qq,1,0}, \ldots, c_{qi,1,(P-1)}, c_{qq,1,(P-1)}, \ldots, c_{qi,M,0}, c_{qq,M,0}, \ldots, c_{qi,M,(P-1)}, c_{qq,M,(P-1)}]^T \quad (6)$ where $[\ ]^T$ denotes predistortion matrix. Then, the predistortion gains are computed in the polynomial calculator 118b by $p = c_{ii,0,0} + c_{ii,0,1} |x(n)| + \ldots + c_{ii,0,(P-1)} |x(n)|^{(P-1)}$ $q = c_{iq,0,0} + c_{iq,0,1} |x(n)| + \ldots + c_{iq,0,(P-1)} |x(n)|^{(P-1)}$ $r = c_{qi,0,0} + c_{qi,0,1} |x(n)| + \ldots + c_{qi,0,(P-1)} |x(n)|^{(P-1)}$ $s = c_{qq,0,0} + c_{qq,0,1} |x(n)| + \ldots + c_{qq,0,(P-1)} |x(n)|^{(P-1)} \quad (7)$ Although Eq. (7) represents the predistortion gains for the input signal x(n), it can represent in the same manner predistortion gains $c_{ii,m,(0 \sim P-1)}$, $c_{iq,m,(0 \sim P-1)}$, $c_{qi,m,(0 \sim P-1)}$, $c_{qq,m,(0 \sim P-1)}$ for a previous mth predistorted signal d(n−m).

Figure 4:
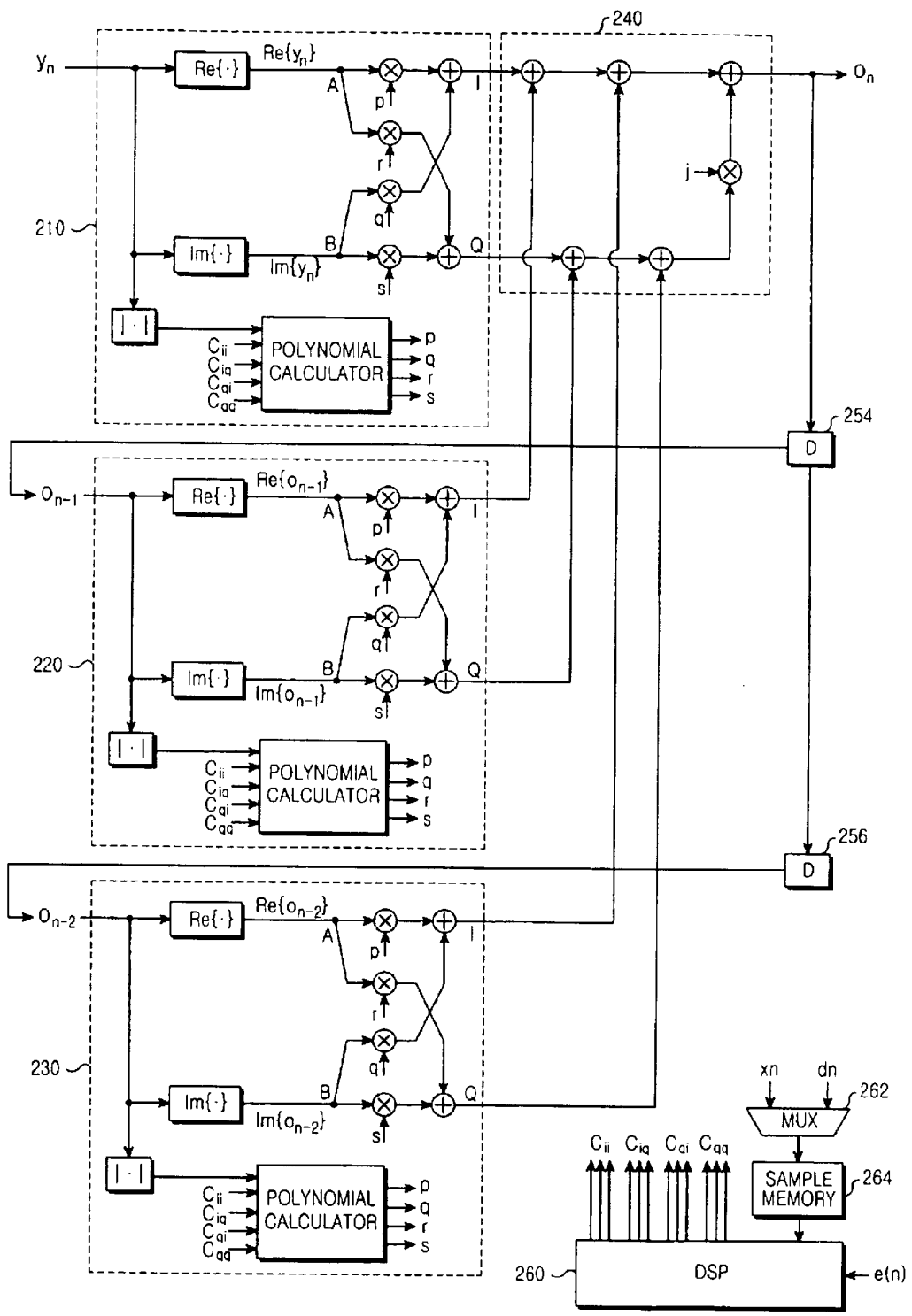
FIG. 4 is a detailed view illustrating a second predistorter according to an embodiment of the present invention.

FIG. 4 illustrates the second predistorter 200 illustrated in FIG. 1 in detail according to an embodiment of the present invention. As illustrated, a first complex multiplier 210 multiplies the current input signal y(n) (interchangeably expressed as $y_n$) by corresponding predistortion gains. The outputs of the first complex multiplier 210 are combined with the outputs of second and third complex multipliers 220 and 230, thereby producing the second predistorted signal o(n) (interchangeably expressed $o_n$). The second complex multiplier 220 multiplies a signal y(n−1) obtained by delaying y(n) one sample time in a delay 254 by corresponding predistortion gains. The third complex multiplier 230 multiplies a signal y(n−2) obtained by delaying y(n) two sample times in delays 254 and 256 by corresponding predistortion gains.

A summer 240 sums the I and Q outputs of the first, second and third complex multipliers 210, 220 and 230, shifts the Q signal component sum by 90°, and adds the shifted Q signal component to the I signal component sum, thus outputting the second predistorted signal $o_n$.

The second predistorted signal o(n) is $$o(n) = o_i(n) + j o_q(n) = y(n) E(c_i + j c_q) \tag{8}$$

where $c_i$ and $c_q$ are the respective I and Q signal components of a complex polynomial coefficient for the input signal o(n).

Using a P-order polynomial and previous samples before up to an Mth sample time, the amplified signal x(n) input to the second predistorter 200 is $$y(n) = [y_i(n), y_q(n), y_i(n)|y(n)|, y_q(n)|y(n)|, \ldots, y_i(n)|y(n)|^{P-1},$$
$$y_q(n)|y(n)|^{P-1}, o_i(n-1), o_q(n-1),$$

$$o_i(n-1)|o(n-1)|, o_q(n-1)|o(n-1)|, \ldots, o_i(n-1)|o(n-1)|^{P-1}, o_q(n-1)|o(n-1)|^{P-1}, o_i(n-M),$$

$$o_q(n-M), o_i(n-M)|o(n-M)|, o_q(n-M)|o(n-M)|, \ldots, o_i(n-M)|o(n-M)|^{P-1}, o_q(n-M)|o(n-M)|^{P-1}] \tag{9}$$

Referring to FIG. 4, a digital signaling processor (DSP) 260 calculates polynomial coefficients $c_{ii}$, $c_{iq}$, $c_{qi}$ and $c_{qq}$ using a known adaptation algorithm such as Recursive Least Square (RLS) or Least Mean Square (LMS), such that an error signal e(n)=d(n)−o(n) is minimized. The polynomial coefficients are formed as illustrated in Eq. (6). These polynomial coefficients are provided to the polynomial calculator 118b of the first predistorter 100. To do so, a sample memory 264 stores y(n) and previous samples of o(n) before up to an Mth sample time received from a multiplexer 262 and provides them to the digital signaling processor 260. The sample memory 264 has a capacity of storing (M+1) samples.

Major effects of the embodiment of the present invention as described above are as follows.

The use of a simplified polynomial compared to a complex discrete Volterra series minimizes computation complexity, a current predistorted signal is generated using previous predistorted signals, and an accurate modeling of the memory effects of a power amplifier enables appropriate linearization of the power amplifier. Also, since I and Q signal component errors are compensated for separately by use of complex polynomial coefficients, each phase error is minimized independently. Therefore, the non-linearity of the power amplifier is effectively compensated for.

While the invention has been shown and described with reference to a certain embodiment thereof, it will be understood by those skilled in the art that various changes in form and details may be made therein without departing from the spirit and scope of the invention as defined by the appended claims.

What is claimed is:

1. A polynomial predistorter for predistorting a complex modulated baseband signal, providing the predistorted signal to a power amplifier, and compensating for the non-linear distortion characteristic of the power amplifier using complex vector multiplication, comprising:

a first complex multiplier for generating first complex predistortion gains using a current input signal and complex polynomial coefficients, for in-phase (I) predistortion and quadrature-phase (Q) predistortion, the complex polynomial coefficients being modeled on the inverse non-linear distortion characteristic of the power amplifier, and multiplying the first complex predistortion gains by I and Q signal components of the current input signal, respectively;

at least one second complex multiplier for generating second complex predistortion gains using the complex polynomial coefficients and previous predistorted signals corresponding to the complex polynomial coefficients, for the I predistortion and the Q predistortion, and multiplying the second complex predistortion gains by I and Q signal components of the previous predistorted signals, respectively; and a summer for generating a predistorted signal by summing outputs of the first and second complex multipliers and outputting the predistorted signal to the power amplifier.

2. The polynomial predistorter of claim 1, wherein the complex polynomial coefficients are determined such that the predistorted signal is output to an input of an amplifier output.

3. The polynomial predistorter of claim 1, wherein the predistorted signal is calculated using $$d(n) = d_i(n) + j d_q(n) = x(n) E(c_i + j c_q)$$

$$x(n) = [x_i(n), x_q(n), x_i(n)|x(n)|, x_q(n)|x(n)|, \ldots, x_i(n)|x(n)|^{P-1},$$
$$x_q(n)|x(n)|^{P-1}, d_i(n-1),$$

$$d_q(n-1), d_i(n-1)|d(n-1)|, d_q(n-1)|d(n-1)|, \ldots, d_i(n-1)|d(n-1)|^{P-1},$$
$$d_q(n-1)|d(n-1)|^{P-1}, d_i(n-M),$$

$$d_q(n-M), d_i(n-M)|d(n-M)|, d_q(n-M)|d(n-M)|, \ldots, d_i(n-M)|d(n-M)|^{P-1},$$
$$d_q(n-M)|d(n-M)|^{P-1}]$$

$$c_i = [c_{ii,0,0}, c_{iq,0,0}, \ldots, c_{ii,0,(P-1)}, c_{iq,0,(P-1)}, c_{ii,1,0}, c_{iq,1,0}, \ldots, c_{ii,1,(P-1)},$$
$$c_{iq,1,(P-1)}, \ldots, c_{ii,M,0}, c_{iq,M,0}, \ldots, c_{ii,M,(P-1)}, c_{iq,M,(P-1)}]^T$$

$$c_q = [c_{qi,0,0}, c_{qq,0,0}, \ldots, c_{qi,0,(P-1)}, c_{qq,0,(P-1)}, c_{qi,1,0}, c_{qq,1,0}, \ldots, c_{qi,1,(P-1)}, c_{qq,1,(P-1)}, \ldots, c_{qi,M,0}, c_{qq,M,0}, \ldots, c_{qi,M,(P-1)}, c_{qq,M,(P-1)}]^T$$

where d(n) is the predistorted signal including an I signal component $d_i(n)$ and a Q signal component $d_q(n)$, x(n) is the input signal including an I signal component $x_i(n)$ and a Q signal component $x_q(n)$, $c_i$ is an I polynomial coefficient including $c_{ii}$ and $c_{iq}$ that affect $x_i(n)$ and $x_q(n)$, respectively, $c_q$ is a Q polynomial coefficient including $c_{qi}$ and $c_{qq}$ that affect $x_i(n)$ and $x_q(n)$, respectively, P is the order of the polynomial, and M is the number of previous signals to consider.

4. The polynomial predistorter of claim 1, wherein each of the first and second complex predistortion gains includes an I complex predistortion gain and a Q complex predistortion gain which are multiplied respectively by the I and Q signal components of the input signal and the previous predistorted signals.

5. The polynomial predistorter of claim 4, wherein the first complex predistortion gains are calculated using $$p = c_{ii,0,0} + c_{ii,0,1}|x(n)| + \ldots + c_{ii,0,(P-1)}|x(n)|^{(P-1)}$$

$$q = c_{iq,0,0} + c_{iq,0,1}|x(n)| + \ldots + c_{iq,0,(P-1)}|x(n)|^{(P-1)}$$

$$r = c_{qi,0,0} + c_{qi,0,1}|x(n)| + \ldots + c_{qi,0,(P-1)}|x(n)|^{(P-1)}$$

$$s = c_{qq,0,0} + c_{qq,0,1}|x(n)| + \ldots + c_{qq,0,(P-1)}|x(n)|^{(P-1)}$$

where x(n) is the input signal, p and q are I predistortion gains by which the I and Q signal components of the input signal are multiplied, r and s are Q predistortion gains by which the I and Q signal components of the input signal are multiplied, $c_{ii}$ and $c_{iq}$ are I polynomial coefficients that affect the I and Q signal components of the input signal, respectively, $c_{qi}$ and $c_{qq}$ are Q polynomial coefficients that affect the I and Q signal components of the input signal, respectively, P is the order of the polynomial, and M is the number of previous signals to consider.

6. The polynomial predistorter of claim 4, wherein the second complex predistortion gains are calculated using $$p = c_{ii,m,0} + c_{ii,m,1}|d(n-m)| + \ldots + c_{ii,m,(P-1)}|d(n-m)|^{(P-1)}$$

$$q = c_{iq,m,0} + c_{iq,m,1}|d(n-m)| + \ldots + c_{iq,m,(P-1)}|d(n-m)|^{(P-1)}$$

$$r = c_{qi,m,0} + c_{qi,m,1}|d(n-m)| + \ldots + c_{qi,m,(P-1)}|d(n-m)|^{(P-1)}$$

$$s = c_{qq,m,0} + c_{qq,m,1}|d(n-m)| + \ldots + c_{qq,m,(P-1)}|d(n-m)|^{(P-1)}$$

where d(n−m) is an mth previous predistorted signal, p and q are I predistortion gains by which the I and Q signal components of the input signal are multiplied, r and s are Q predistortion gains by which the I and Q signal components of the input signal are multiplied, $c_{ii}$ and $c_{iq}$ are I polynomial coefficients that affect the I and Q signal components of the input signal, respectively, $c_{qi}$ and $c_{qq}$ are Q polynomial coefficients that affect the I and Q signal components of the input signal, respectively, P is the order of the polynomial, and M is the number of previous signals to consider.

7. A polynomial predistorting method of predistorting a complex modulated baseband signal, providing the predistorted signal to a power amplifier, and compensating for the non-linear distortion characteristic of the power amplifier using complex vector multiplication, comprising the steps of:

generating first complex predistortion gains using a current input signal and complex polynomial coefficients, for in-phase (I) predistortion and quadrature-phase (Q) predistortion, the complex polynomial coefficients being modeled on the inverse non-linear distortion characteristic of the power amplifier, and multiplying the first complex predistortion gains by I and Q signal components of the current input signal, respectively;

generating second complex predistortion gains using the complex polynomial coefficients and a predetermined number of previous predistorted signals, for the I predistortion and the Q predistortion, and multiplying the second complex predistortion gains by I and Q signal components of the previous predistorted signals, respectively; and generating a predistorted signal by summing outputs of the first and second complex multipliers and outputting the predistorted signal to the power amplifier.

8. The polynomial predistorting method of claim 7, wherein the complex polynomial coefficients are determined such that the predistorted signal is output to an input of an amplifier output.

9. The polynomial predistorting method of claim 7, wherein the predistorted signal is calculated using $$d(n) = d_i(n) + jd_q(n) = x(n)E(c_i + jc_q)$$

$$x(n) = [x_i(n), x_q(n), x_i(n)|x(n)|, x_q(n)|x(n)|, \ldots, x_i(n)|x(n)|^{P-1}, x_q(n)|x(n)|^{P-1}, d_i(n-1),$$

$$d_q(n-1), d_i(n-1)|d(n-1)|, d_q(n-1)|d(n-1)|, \ldots, d_i(n-1)|d(n-1)|^{P-1}, d_q(n-1)|d(n-1)|^{P-1}, d_i(n-M),$$

$$d_q(n-M), d_i(n-M)|d(n-M)|, d_q(n-M)|d(n-M)|, \ldots, d_i(n-M)|d(n-M)|^{P-1}, d_q(n-M)|d(n-M)|^{P-1}]$$

$$c_i = [c_{ii,0,0}, c_{iq,0,0}, \ldots, c_{ii,0,(P-1)}, c_{iq,0,(P-1)}, c_{ii,1,0}, c_{iq,1,0}, \ldots, c_{ii,1,(P-1)}, c_{iq,1,(P-1)}, \ldots, c_{ii,M,0}, c_{iq,M,0}, \ldots, c_{ii,M,(P-1)}, c_{iq,M,(P-1)}]^T$$

$$c_q = [c_{qi,0,0}, c_{qq,0,0}, \ldots, c_{qi,0,(P-1)}, c_{qq,0,(P-1)}, c_{qi,1,0}, c_{qq,1,0}, \ldots, c_{qi,1,(P-1)}, c_{qq,1,(P-1)}, \ldots, c_{qi,M,0}, c_{qq,M,0}, \ldots, c_{qi,M,(P-1)}, c_{qq,M,(P-1)}]^T$$

where d(n) is the predistorted signal including an I signal component $d_i(n)$ and a Q signal component $d_q(n)$, x(n) is the input signal including an I signal component $x_i(n)$ and a Q signal component $x_q(n)$, $c_i$ is an I polynomial coefficient including $c_{ii}$ and $c_{iq}$ that affect $x_i(n)$ and $x_q(n)$, respectively, $c_q$ is a Q polynomial coefficient including $c_{qi}$ and $c_{qq}$ that affect $x_i(n)$ and $x_q(n)$, respectively, P is the order of the polynomial, and M is the number of previous signals to consider.

10. The polynomial predistorting method of claim 7, wherein each of the first and second complex predistortion gains includes an I complex predistortion gain and a Q complex predistortion gain which are multiplied respectively by the I and Q signal components of the input signal and the previous predistorted signals.

11. The polynomial predistorting method of claim 10, wherein the first complex predistortion gains are calculated using $$p = c_{ii,0,0} + c_{ii,0,1}|x(n)| + \ldots + c_{ii,0,(P-1)}|x(n)|^{(P-1)}$$

$$q = c_{iq,0,0} + c_{iq,0,1}|x(n)| + \ldots + c_{iq,0,(P-1)}|x(n)|^{(P-1)}$$

$$r = c_{qi,0,0} + c_{qi,0,1}|x(n)| + \ldots + c_{qi,0,(P-1)}|x(n)|^{(P-1)}$$

$$s = c_{qq,0,0} + c_{qq,0,1}|x(n)| + \ldots + c_{qq,0,(P-1)}|x(n)|^{(P-1)}$$

where x(n) is the input signal, p and q are I predistortion gains by which the I and Q signal components of the input signal are multiplied, r and s are Q predistortion gains by which the I and Q signal components of the input signal are multiplied, $c_{ii}$ and $c_{iq}$ are I polynomial coefficients that affect the I and Q signal components of the input signal, respectively, $c_{qi}$ and $c_{qq}$ are Q polynomial coefficients that affect the I and Q signal components of the input signal, respectively, P is the order of the polynomial, and M is the number of previous signals to consider.

12. The polynomial predistorting method of claim 10, wherein the second complex predistortion gains are calculated using $$p = c_{ii,m,0} + c_{ii,m,1}|d(n-m)| + \ldots + c_{ii,m,(P-1)}|d(n-m)|^{(P-1)}$$

$$q = c_{iq,m,0} + c_{iq,m,1}|d(n-m)| + \ldots + c_{iq,m,(P-1)}|d(n-m)|^{(P-1)}$$

$$r = c_{qi,m,0} + c_{qi,m,1}|d(n-m)| + \ldots + c_{qi,m,(P-1)}|d(n-m)|^{(P-1)}$$

$$s = c_{qq,m,0} + c_{qq,m,1}|d(n-m)| + \ldots + c_{qq,m,(P-1)}|d(n-m)|^{(P-1)}$$

where d(n−m) is an mth previous predistorted signal, p and q are I predistortion gains by which the I and Q signal components of the input signal are multiplied, r and s are Q predistortion gains by which the I and Q signal components of the input signal are multiplied, $c_{ii}$ and $c_{iq}$ are I polynomial coefficients that affect the I and Q signal components of the input signal, respectively, $c_{qi}$ and $c_{qq}$ are Q polynomial coefficients that affect the I and Q signal components of the input signal, respectively, P is the order of the polynomial, and M is the number of previous signals to consider.

* * * * *